(12) United States Patent
Yang

(10) Patent No.: US 7,298,539 B2
(45) Date of Patent: Nov. 20, 2007

(54) CO-PLANAR SURFACE AND TORSION DEVICE MIRROR STRUCTURE AND METHOD OF MANUFACTURE FOR OPTICAL DISPLAYS

(75) Inventor: Xiao Yang, Cupertino, CA (US)

(73) Assignee: Miradia Inc., Sunnyvale, CA (US)

( * ) Notice: Subject to any disclaimer, the term of this patent is extended or adjusted under 35 U.S.C. 154(b) by 10 days.

(21) Appl. No.: 11/143,363

(22) Filed: Jun. 1, 2005

(65) Prior Publication Data

US 2006/0274397 A1 Dec. 7, 2006

(51) Int. Cl.
*G02F 1/03* (2006.01)

(52) U.S. Cl. ..................................... 359/245

(58) Field of Classification Search ............... 359/290, 359/291, 292, 295, 298, 220, 222, 223, 224, 359/320, 322
See application file for complete search history.

(56) References Cited

U.S. PATENT DOCUMENTS

| | | | |
|---|---|---|---|
| 4,229,732 A | 10/1980 | Hartstein et al. | |
| 4,317,611 A | 3/1982 | Petersen | |
| 4,566,935 A | 1/1986 | Hornbeck | |
| 4,615,595 A | 10/1986 | Hornbeck | |
| 5,061,049 A | 10/1991 | Hornbeck | |
| 5,172,262 A | 12/1992 | Hornbeck | |
| 5,311,360 A | 5/1994 | Bloom et al. | |
| 5,382,961 A | 1/1995 | Gale, Jr. | |
| 5,448,314 A | 9/1995 | Heimbuch et al. | |
| 5,452,024 A | 9/1995 | Sampsell | |
| 5,489,952 A | 2/1996 | Gove et al. | |
| 5,504,614 A | 4/1996 | Webb et al. | |
| 5,535,047 A | 7/1996 | Hornbeck | |
| 5,583,688 A | 12/1996 | Hornbeck | |
| 5,589,852 A | 12/1996 | Thompson et al. | |
| 5,600,383 A | 2/1997 | Hornbeck | |
| 5,661,591 A | 8/1997 | Lin et al. | |

(Continued)

FOREIGN PATENT DOCUMENTS

EP 1237032 A2 9/2002

OTHER PUBLICATIONS

Henley et al., "A New SOI Manufacturing Technology Using Atomic layer Cleaving." Silicon Genesis Corporation Campbell CA. pp. 1-5.

(Continued)

*Primary Examiner*—Ricky Mack
*Assistant Examiner*—Tuyen Tra
(74) *Attorney, Agent, or Firm*—Townsend and Townsend and Crew LLP

(57) ABSTRACT

A spatial light modulator is provided. The spatial light modulator includes a first substrate comprising a plurality of electrically activated electrodes and a bias grid and a standoff structure coupled to the first substrate. The standoff structure includes a central portion projecting to a first height above the first substrate and an extension portion projecting to a second height above the first substrate, the second height being less than the first height. The spatial light modulator also includes a mirror plate comprising a central contact structure integrally formed with the central portion of the standoff structure, a torsion beam coplanar with the central contact structure and free from contact with the standoff structure, and a reflective surface coupled to the plurality of torsion arms and free from contact with the standoff structure.

22 Claims, 9 Drawing Sheets

U.S. PATENT DOCUMENTS

| | | | |
|---|---|---|---|
| 5,663,749 | A | 9/1997 | Farris et al. |
| 5,742,419 | A | 4/1998 | Dickensheets et al. |
| 5,757,536 | A | 5/1998 | Ricco et al. |
| 5,835,256 | A | 11/1998 | Huibers |
| 5,885,468 | A | 3/1999 | Kozlowski |
| 5,939,171 | A | 8/1999 | Biebl |
| 5,999,306 | A | 12/1999 | Atobe et al. |
| 6,038,056 | A | 3/2000 | Florence et al. |
| 6,046,840 | A | 4/2000 | Huibers |
| 6,049,317 | A | 4/2000 | Thompson et al. |
| 6,127,756 | A | 10/2000 | Iwaki et al. |
| 6,172,797 | B1 | 1/2001 | Huibers |
| 6,201,521 | B1 | 3/2001 | Doherty |
| 6,252,277 | B1 | 6/2001 | Chan et al. |
| 6,323,982 | B1 | 11/2001 | Hornbeck |
| 6,337,760 | B1 | 1/2002 | Huibers et al. |
| 6,356,378 | B1 | 3/2002 | Huibers |
| 6,388,661 | B1 | 5/2002 | Richards |
| 6,396,619 | B1 | 5/2002 | Huibers et al. |
| 6,429,033 | B1 | 8/2002 | Gee et al. |
| 6,529,310 | B1 | 3/2003 | Huibers et al. |
| 6,538,800 | B2 | 3/2003 | Huibers |
| 6,543,286 | B2 | 4/2003 | Garverick et al. |
| 6,809,852 | B2 | 10/2004 | Tao et al. |
| 6,827,866 | B1 | 12/2004 | Novotny |
| 6,856,068 | B2 | 2/2005 | Miller et al. |
| 6,980,349 | B1 * | 12/2005 | Huibers et al. ............. 359/291 |
| 2002/0041455 | A1 | 4/2002 | Sawada et al. |
| 2002/0071166 | A1 | 6/2002 | Jin et al. |
| 2002/0071169 | A1 | 6/2002 | Bowers et al. |
| 2002/0132389 | A1 | 9/2002 | Patel et al. |
| 2003/0117686 | A1 | 6/2003 | DiCarlo |
| 2003/0207487 | A1 | 11/2003 | Kubena et al. |
| 2004/0000696 | A1 | 1/2004 | Ma et al. |
| 2004/0004753 | A1 | 1/2004 | Pan |
| 2004/0008402 | A1 | 1/2004 | Patel et al. |
| 2004/0125347 | A1 | 7/2004 | Patel et al. |
| 2004/0136044 | A1 | 7/2004 | Miller et al. |
| 2004/0184133 | A1 | 9/2004 | Su et al. |
| 2004/0190817 | A1 | 9/2004 | Aubuchon |
| 2005/0041277 | A1 | 2/2005 | Huibers |

OTHER PUBLICATIONS

Petersen, K.E., Micromechanical Light Modulator Array Fabricated On Silicon. Applied Physics Letters. Oct. 15, 1977, pp. 521-523, vol. 31 No. 8.

Petersen, K.E., Micromechanical Membrane Switches On Silicon. IBM J. Res. Develop., Jul. 1979, pp. 376-385. vol. 23, No. 4.

* cited by examiner

100% CO-PLANAR SURFACE AND TORSION DEVICE MIRROR STRUCTURE AND METHOD OF MANUFACTURE FOR OPTICAL DISPLAYS

CROSS-REFERENCES TO RELATED APPLICATIONS

The following two regular U.S. patent applications (including this one) are being filed concurrently, and the entire disclosure of the other application is incorporated by reference into this application for all purposes.

U.S. application Ser. No. 11/143,363; filed Jun. 1, 2005, entitled "Co-Planar Surface and Torsion Device Mirror Structure and Method of Manufacture for Optical Displays"

U.S. application Ser. No. 11/143,371; filed Jun. 1, 2005, entitled "Method and Device for Fabricating a Release Structure to Facilitate Bonding of Mirror Devices onto a Substrate"

BACKGROUND OF THE INVENTION

This present invention relates generally to manufacturing objects. More particularly, the invention relates to a method and structure for fabricating a spatial light modulator with a co-planar surface and torsion device. Merely by way of example, the invention has been applied to the formation of a spatial light modulator having a torsion spring and mirror plate positioned in the same plane. The method and device can be applied to spatial light modulators as well as other devices, for example, micro-electromechanical sensors, detectors, and displays.

Micro-electromechanical systems (MEMS) are used in a number of application areas. For example, MEMS have been used in micro-mirror arrays, sensors, and actuators. In some of these applications, a suspended member is supported by a flexible hinge attached to a stationary portion of the mirco-mirror array. Flexibly attached to the hinge, the suspended member is attracted to an electrode upon application of an electrical force and restored to an original position by a restoring force. In this manner, the array of micro-mirrors can be tilted in relation to a light source. In some applications, it is beneficial to have the hinge located beneath the micro-mirror surface in a hidden position, enabling the fill factor of the array to be increased. As the fill factor of the micro-mirror array is increased, the potential quality of two-dimensional images created by optical systems using the array is improved.

As merely an example, some conventional MEMS have utilized various micro-mirror designs, such as micro-mirrors mounted on flexible pedestals coupled to the backside of the micro-mirror surface. In some of these designs, the flexible pedestals extending from the mirror substrate are bonded to a control substrate using a wafer bonding process. However, in these designs, the reliability and repeatability of the process of bonding the flexible posts to the control substrate may be reduced due to the small surface areas joined during the bonding process. Thus, there is a need in the art for methods and apparatus for an improved support structure adapted to couple mirror devices to a control substrate.

SUMMARY OF THE INVENTION

According to the present invention, techniques for manufacturing objects are provided. More particularly, the invention relates to a method and structure for fabricating a spatial light modulator with a co-planar surface and torsion device. Merely by way of example, the invention has been applied to the formation of a spatial light modulator having a torsion spring and mirror plate positioned in the same plane. The method and device can be applied to spatial light modulators as well as other devices, for example, micro-electromechanical sensors, detectors, and displays.

According to a specific embodiment of the present invention, a spatial light modulator is provided. The spatial light modulator includes a first substrate comprising a plurality of electrically activated electrodes and a bias grid. The spatial light modulator also includes a standoff structure coupled to the first substrate. The standoff structure includes a central portion projecting to a first height above the first substrate and an extension portion projecting to a second height above the first substrate, the second height being less than the first height. The spatial light modulator also includes a mirror plate including a central contact structure integrally formed with the central portion of the standoff structure, a torsion beam coplanar with the central contact structure and free from contact with the standoff structure, and a reflective surface coupled to the torsion beam and free from contact with the standoff structure.

According to another specific embodiment of the present invention, a micro-mirror flexibly supported by a standoff structure is provided. The micro-mirror includes a mirror layer having an upper surface adapted to reflect incident radiation and a lower surface opposite the upper surface. The standoff structure includes a first portion integrally formed with the mirror layer. The first portion includes a first planar interface coupled to the lower surface of the mirror layer, a second planar interface opposite the first planar interface, and a body section extending along a first axis from the first planar interface to the second planar interface. The standoff structure further includes a second portion extending along a second axis perpendicular to the first axis. The second portion includes an upper surface physically separated from the plane of the first planar interface by a first distance, a lower surface coplanar with the second planar interface, and a body section extending along the first axis. The micro-mirror also includes a substrate coupled to the second planar interface of the first portion of the standoff structure and to the lower surface of the second portion of the standoff structure.

According to an alternative embodiment of the present invention, a method of fabricating a spatial light modulator is provided. The method includes providing a first substrate structure comprising a plurality of layers and forming a standoff structure in a first layer selected from the plurality of layers of the first substrate structure. The method further includes providing a second substrate comprising a bonding surface and a support surface and joining the standoff structure to the bonding surface of the second substrate. The method also includes removing at least a second layer selected from the plurality of layers of the first substrate structure, selectively patterning the first layer of the first substrate structure to form a micro-mirror, and selectively patterning the first layer to remove a portion of the standoff structure and form a torsion spring hinge co-planar with the micro-mirror.

Many benefits are achieved by way of the present invention over conventional techniques. For example, the present technique provides an easy to use process that relies upon conventional technology. In some embodiments, the method provides for a spatial light modulator with an increased fill-factor. Additionally, the method provides a process that is compatible with conventional process technology without substantial modifications to conventional equipment and processes. Preferably, the invention provides for an improved integrated structure including integrated circuits and mirror structures for display applications. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF SPECIFIC EMBODIMENTS

According to the present invention, techniques for manufacturing objects are provided. More particularly, the invention relates to a method and structure for fabricating a spatial light modulator with a co-planar surface and torsion device. Merely by way of example, the invention has been applied to the formation of a spatial light modulator having a torsion spring and mirror plate positioned in the same plane. The method and device can be applied to spatial light modulators as well as other devices, for example, micro-electromechanical sensors, detectors, and displays.

Figure 1:
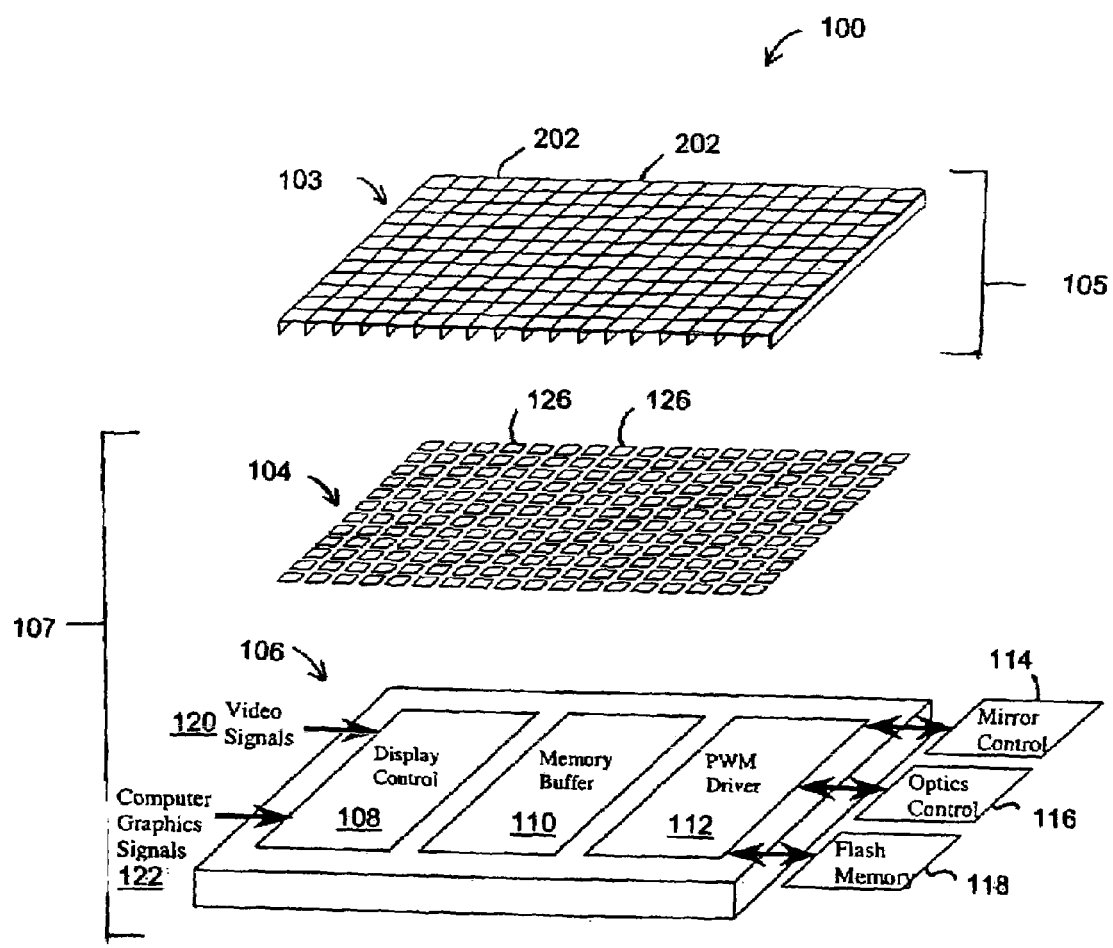
FIG. 1 is a diagram that illustrates the general architecture of a spatial light modulator (SLM) 100 according to an embodiment of the invention.

FIG. 1 is a diagram that illustrates the general architecture of a spatial light modulator (SLM) 100. The illustrated embodiment has three layers. The first layer is a mirror array 103 that has a plurality of deflectable micro-mirrors 202. In a preferred embodiment, the micro-mirror array 103 is fabricated from a first substrate 105 that is a single material, such as single crystal silicon. An example of one way of forming this SLM is described in U.S. patent application Ser. No. 10/378,056, filed Feb. 27, 2003, commonly owned, and hereby incorporated by reference for all purposes.

The second layer is an electrode array 104 with a plurality of electrodes 126 for controlling the micro-mirrors 202. Each electrode 126 is associated with a micro-mirror 202 and controls the deflection of that micro-mirror 202. Addressing circuitry allows selection of a single electrode 126 for control of the particular micro-mirror 202 associated with that electrode 126.

The third layer is a layer of control circuitry 106. This control circuitry 106 has addressing circuitry, which allows the control circuitry 106 to control a voltage applied to selected electrodes 126. This allows the control circuitry 106 to control the deflections of the mirrors 202 in the mirror array 103 via the electrodes 126. Typically, the control circuitry 106 also includes a display control 108, line memory buffers 110, a pulse width modulation array 112, and inputs for video signals 120 and graphics signals 122. A microcontroller 114, optics control circuitry 116, and a flash memory 118 may be external components connected to the control circuitry 106, or may be included in the control circuitry 106 in some embodiments. In various embodiments, some of the above listed parts of the control circuitry 106 may be absent, may be on a separate substrate and connected to the control circuitry 106, or other additional components may be present as part of the control circuitry 106 or connected to the control circuitry 106.

In an embodiment according to the present invention, both the second layer 104 and the third layer 106 are fabricated using semiconductor fabrication technology on a single second substrate 107. That is, the second layer 104 is not necessarily separate and above the third layer 106. Rather, the term "layer" is an aid for conceptualizing different parts of the spatial light modulator 100. For example, in one embodiment, both the second layer 104 of electrodes is fabricated on top of the third layer of control circuitry 106, both fabricated on a single second substrate 107. That is, the electrodes 126, as well as the display control 108, line memory buffers 110, and the pulse width modulation array 112 are all fabricated on a single substrate in one embodiment. Integration of several functional components of the control circuitry 106 on the same substrate provides an advantage of improved data transfer rate over conventional spatial light modulators, which have the display control 108 line memory buffers 110, and the pulse width modulation array 112 fabricated on a separate substrate. Further, fabricating the second layer of the electrode array 104 and the third layer of the control circuitry 106 on a single substrate 107 provides the advantage of simple and cheap fabrication, and a compact final product. After the layers 103, 104, and 106 are fabricated, they are bonded together to form the SLM 100. Additional examples of methods for joining the substrates to form a bonded substrate structure are described in U.S. patent application Ser. No. 10/756,923, filed Jan. 13, 2004, commonly owned, and hereby incorporated by reference for all purposes.

As illustrated in FIG. 1, the substrate 105 includes a number of standoff regions extending from a lower portion of the substrate and arranged in an array as a waffle pack grid pattern. The standoff regions are adapted to align with bonding areas located between adjacent electrodes 126. Mirrors 202 are formed in the upper layers of substrate 105 by a release process in later stages of processing. In some designs, the standoff regions provide mechanical support for the mirror structure and are not moveable. Thus, light reflected from the upper surfaces of the standoff structures reduces the contrast of the optical system incorporating the spatial light modulator. In some designs, an absorbent material may be applied to the upper surfaces of the standoff regions to reduce reflections. However, these approaches reduce the fill factor of the array, potentially degrading system performance.

Figure 2A:
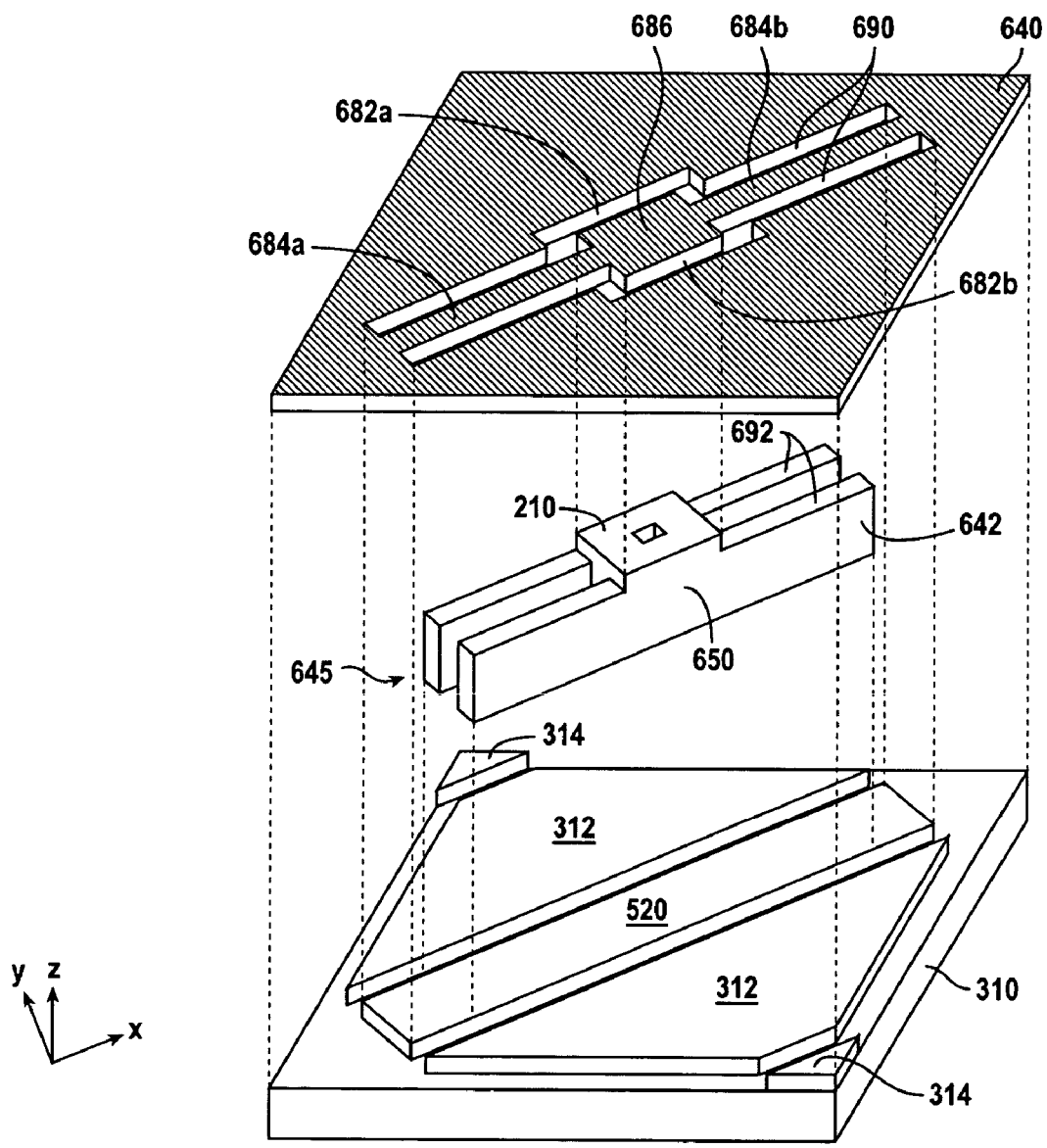
FIG. 2A is a simplified exploded perspective view of a micro-mirror fabricated according to an embodiment of the present invention.

FIG. 2A is a simplified exploded perspective view of a micro-mirror fabricated according to one embodiment of the present invention. This diagram is merely an example, which should not unduly limit the scope of the claims herein. One of ordinary skill in the art would recognize many variations, modifications, and alternatives. As illustrated in FIG. 2A, a portion of CMOS substrate 310 includes electrodes 312, landing pads 314, and bonding surface 520. Standoff structure 645 includes an integrated surface 210 coupled to the lower surface (not shown) of the mirror layer 640 and a bonding surface (not shown) opposite the integrated surface 210. The standoff structure 645 also includes centrally located base section 650 extending from the integrated surface to the bonding surface along a first axis and lateral extension arms 642 extending from the base section along a second axis orthogonal to the first axis. As further illustrated in FIG. 2A, the first axis is aligned with the z-axis and the extension arms extend from the base section along the x-axis. Of course, this arrangement is not required by the present invention. One of ordinary skill in the art would recognize many variations, modifications, and alternatives.

Referring to FIG. 2A, a torsion beam is defined in the mirror layer 640 by openings 690 along with openings 682a and 682b. In an embodiment of the present invention, the torsion beam includes two torsion spring arms 684a and 684b that extend away from two sides of central base section 686. As illustrated, the torsion spring arms are coplanar with the mirror layer 640 and extend along the x-axis. Each of the torsion spring arms are fixed to the central base section and the mirror plate at the diagonal corners of the mirror plate. Accordingly, the mirror layer 640 is free to rotate in the y-z plane in response to activation of the electrodes 312. As the mirror layer rotates about the x-axis, a restoring torque is present in the torsion beam. Of course, this geometry is only one of a number of geometries provided by embodiments of the present invention.

Figure 2B:
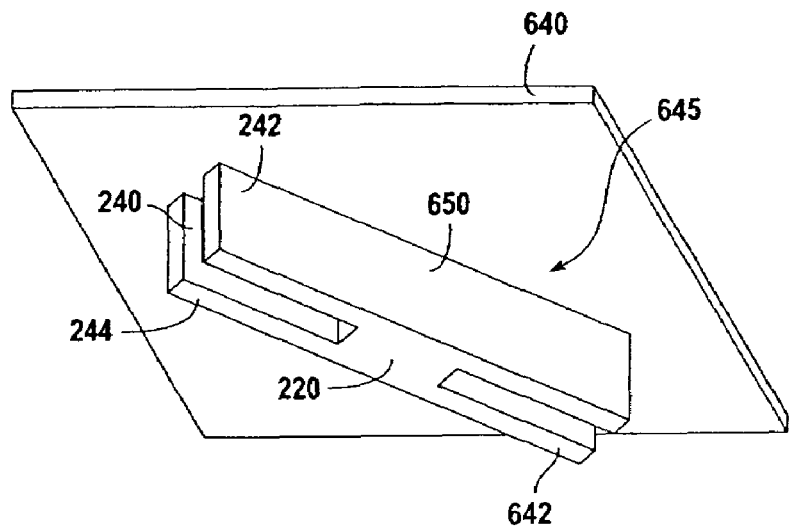
FIG. 2B is a simplified perspective view of a mirror substrate according to an embodiment of the present invention.

FIG. 2B is a simplified perspective view of a mirror substrate according to an embodiment of the present invention. As illustrated in FIG. 2B, mirror layer 640 has been inverted and electrode substrate 310 has been omitted, showing the bonding surface 220 of the standoff structure 645 and the underside of mirror layer 640. As will be described more fully below, the mirror substrate including the mirror layer 640 and the standoff structure 645 is wafer bonded to substrate 310 in a specific embodiment of the present invention. Referring to the illustration provided in FIG. 2B, bonding surface 220 extends along the entire face of the standoff structure and is bonded to bonding surface 520 using techniques described more fully below. Subsequently, mirror layer 640 and standoff structure 645 are preferentially etched from the upper side of the mirror layer to form openings 690 and remove the support provided by standoff structure 645 for portions of the mirror layer 640.

As described with reference to FIG. 6B below, a layer of a composite substrate structure is processed to form the standoff structure 645. In the illustrated embodiment, the standoff structure is fabricated using an etching process that terminates at the underside of layer 640. As illustrated, extension arms 642 extend from opposite sides of central section 650. In particular, adjacent arms 242 and 244 are separated by openings 240. The dimensions of the standoff structure, in particular the height to which the structure extends from layer 640, the dimensions of central section 650, the width and length of the extension arms, and the spacing 240 between the arms are predetermined according to embodiments of the present invention.

Figure 2C:
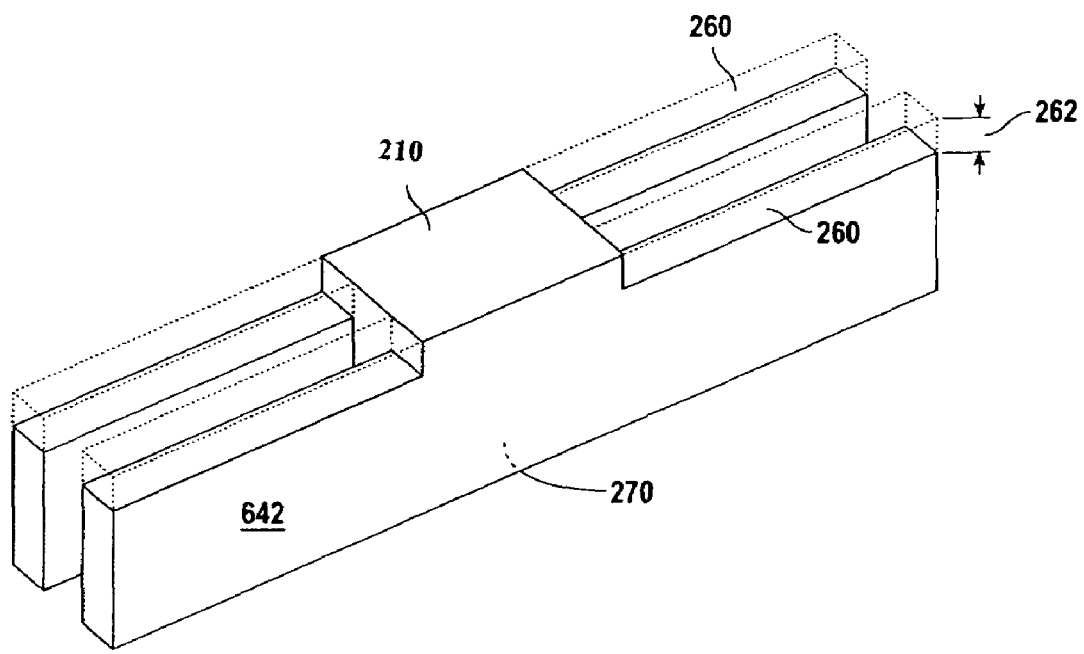
FIG. 2C is a simplified perspective illustration of a standoff structure at an intermediate stage of processing according to an embodiment of the present invention.

FIG. 2C is a simplified perspective illustration of a standoff structure at an intermediate stage of processing according to an embodiment of the present invention. In the embodiment of the present invention illustrated in FIG. 2C, the standoff structure includes a release section 260 that is removed during a release step. Additional details of the fabrication process are discussed below. Initially integrally formed with the mirror layer, the release section 260 includes portions extending along both sets of extension arms 642. The thickness 262 of the release section is defined during the release step and is typically a function of the etch process used to remove the release section, as described more fully below. In some embodiments, the thickness 262 is selected to ensure that the mirror plate does not make contact with the extension arms 642 when the mirror is placed in an activated state. As illustrated in FIG. 2C, the upper surface 220 of the standoff structure, which is an integrated layer coupled to the mirror layer, has a smaller surface area than the lower surface 270 of the standoff structure, which is bonded to the second substrate as described more fully below. As illustrated in FIG. 2C, the lower surface area of the standoff structure is equal to the surface area of the extension arms plus the surface area of the surface 830.

In some embodiments the strength of the bond per unit area between the standoff structure and the second substrate is less than the strength of the bond between layer 220 and the mirror due to the integrated nature of the interface. However, because of the ratio of areas between surfaces 220 and 270, the total strength of the bond and material are balanced and may be equal or different. For example, the presence of voids between surface 270 and the electrode substrate is counteracted by the bond area provided by the extension arms 642.

Figure 3A:
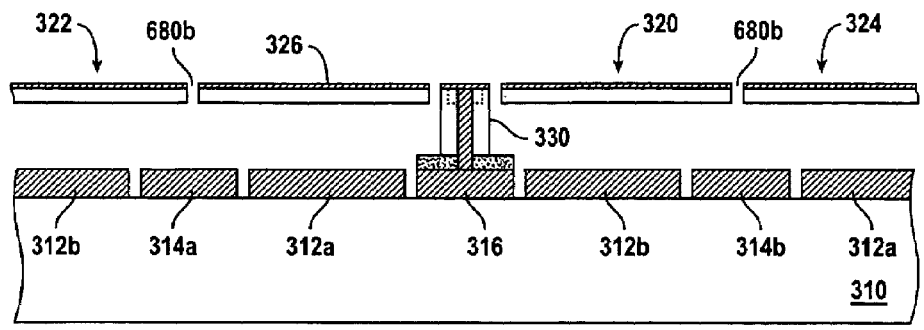
FIGS. 3A and 3B are simplified side-view illustrations of a portion of a spatial light modulator according to an embodiment of the present invention.
Figure 3B:
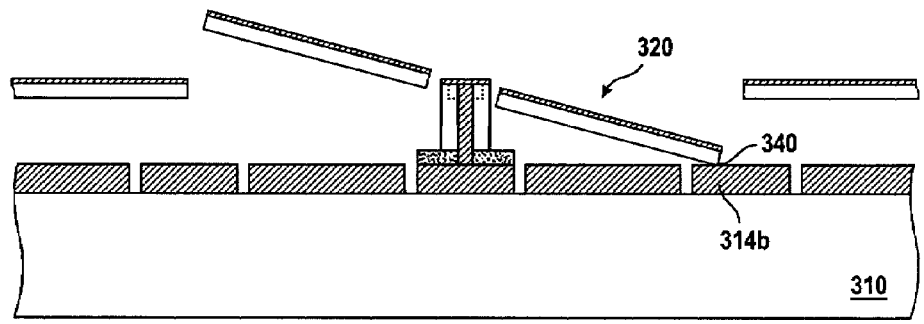

FIGS. 3A-3B are simplified side-view illustrations of a portion of a spatial light modulator according to an embodiment of the present invention. As illustrated in FIG. 3A, a micro-mirror 320 is symmetrically located with respect to standoff structure 330 and is illustrated in an unactivated position. Portions of additional micro-mirrors 322 and 324 are illustrated on opposite sides of micro-mirror 320. Electrode substrate 310 is illustrated in the figure and is typically a CMOS substrate. In a particular embodiment, substrate 310 includes complementary electrodes 312a and 312b, as well as display control, line memory buffers, and the pulse width modulation array circuitry (not shown) as described above. In a specific embodiment, electrodes 312 are fabricated from a number of materials that conduct electricity and are referred to as control electrodes because they are used to control the deflection of the mirrors associated with the electrodes. Merely by way of example, the control electrodes in the embodiment according to the present invention illustrated in FIGS. 3A and 3B are made of a multi-layer stack of metals preferentially deposited on the surface of substrate 310. Preferably, the electrode is made of a deposited titanium nitride (TiN) layer, a deposited aluminum layer, and a second deposited TiN layer. In alternative embodiments according to the present invention, the electrodes are made of tungsten or other suitable conductors. The thickness of the electrode stack making up electrodes 312 in one embodiment is 8,000 Å.

In addition to the formation of control electrodes 312 on the surface of substrate 310, landing pads 314 are formed in embodiments of the present invention. In a specific embodiment, the landing pads 314a and 314b also serve as bias electrodes and are formed during the same fabrication processes as the control electrodes. For example, in one embodiment, the landing pads/bias electrodes are made of a multi-layer stack of metals preferentially deposited on the surface of substrate 310. Preferably, the landing pad is made of a deposited titanium nitride (TiN) layer, a deposited aluminum layer, and a second deposited TiN layer. In alternative embodiments according to the present invention, the landing pads/bias electrodes 314 are made of tungsten or other suitable conductors.

Moreover, FIG. 3A illustrates support pad 316. In a specific embodiment, a number of support pads 316 are fabricated on substrate 310 and also serve as bias electrodes. In some embodiments, the support pads 316 are formed during the same fabrication processes as the control electrodes. For example, in an embodiment, the support pads 316 are made of a multi-layer stack of metals preferentially deposited on the surface of substrate 310. Preferably, the support pads 316 are made of a deposited titanium nitride (TiN) layer, a deposited aluminum layer, and a second deposited TiN layer. In alternative embodiments according to the present invention, the support pads 316 are made of tungsten or other suitable conductors. In some embodiments, the support pads 316 are coupled to a bias grid (not shown).

Micro-mirror 320 is attached to standoff structure 330 a by torsion spring hinge and the standoff structure is coupled to the substrate 310. In the embodiment illustrated in FIG. 3, a portion of the upper surface 326 of the micro-mirror is a reflective surface. For example, the power reflectance of portions of upper surface 326 may be greater than or equal to 90%. Moreover, in an embodiment according to the present invention, the flexible member is a vertical torsion spring, in which the height of the hinge is greater than the width, but this is not required by the present invention. Alternative embodiments according to the present invention use other flexible members that bend in response to applied forces and subsequently return to their original shape after removal of such applied forces.

FIG. 3B illustrates a micro-mirror 320 in an activated position. In the state illustrated in FIG. 3B, a voltage $V_A$ has been applied to the electrode 312, deflecting the left side of the moveable structure away from the electrode and creating a restoring counter-clockwise torque in the torsion spring. In FIG. 3, the torque lies in the plane of the figure. In an embodiment according to the present invention, at least one landing pad 314b is adapted to make contact with the micro-mirror at location 340. The landing pad is fabricated from suitable materials as described above.

As illustrated in FIG. 3B, the right side of the micro-mirror makes contact with landing pad 314b. However, this is not required by the present invention. An example of one way of utilizing landing pads and landing posts to reduce the amount and impact of contact between the micro-mirror and the first surface is described in U.S. patent application Ser. No. 10/718,482, filed Nov. 19, 2003, commonly owned, and hereby incorporated by reference for all purposes. Moreover, in alternative embodiments, the electrodes may be elevated to other predetermined distances above the first surface, reducing the distance between the electrodes and the micro-mirror, and thereby increasing the electrostatic forces resulting from the application of voltages to the electrodes.

Although FIGS. 3A and 3B illustrate a micro-mirror transitioning between an unactivated (horizontal) state and an activated (tilted) state, this is not required by the present invention. In alternative embodiments, the micro-mirror transitions between states in which the mirror is tilted in opposite directions. In embodiments according to the present invention, the height and position of the standoff structure are selected so that the upper surface of the micro-mirror is tilted at a predetermined angle with respect to the horizontal when the micro-mirror is in the activated state. For example, the mirror may transition from a state in which the micro-mirror is tilted at 12° to the horizontal as illustrated in FIG. 3B and a state in which the micro-mirror is tilted at an angle of −12° to the horizontal. In these alternative embodiments, the increase in available tilt angle provides for improvements in system contrast when the micro-mirror array is integrated into a projection display system.

In some embodiments of the present invention, the landing pads are formed from other materials selected for such properties as electrical conductivity and mechanical rigidity. For example, in an embodiment, the landing pads are formed from tungsten. In other embodiments, other materials, including polysilicon and aluminum are used to form the landing pads. Of course, one of ordinary skill in the art would recognize many variations, modifications, and alternatives.

Comparison of FIGS. 1 and 3 will illustrate one of the benefits provided by embodiments of the present invention. Since the spatial light modulator in FIG. 3 is centrally supported by standoff structure 330, rather than a waffle pack grid structure surrounding micro-mirrors 320, the fill factor of an array of spatial light modulators fabricated according to embodiments of the present invention, which is a function of the gap between adjacent micro-mirrors, can be higher than in some alternative designs. In embodiments in which the openings 680a and 680b are defined using well developed photolithographic processes, the dimensions of the openings are generally well-controlled and may be as small as sub-micron dimensions. Accordingly, high fill factors are available using embodiments of the present invention.

Figure 4:
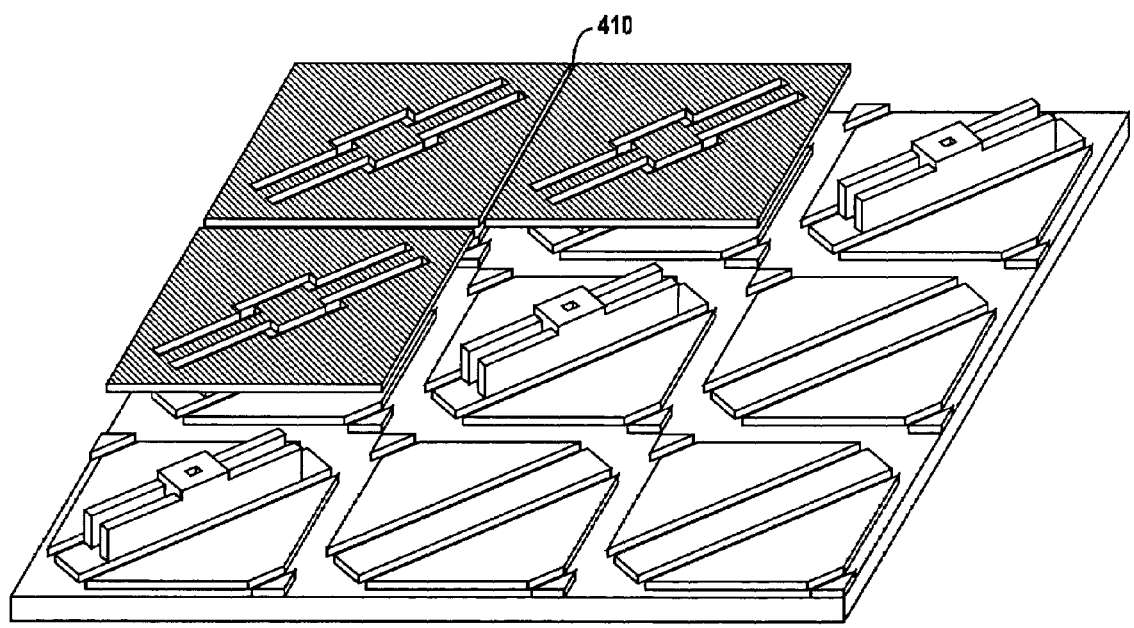
FIG. 4 is a simplified perspective view of a spatial light modulator array including an array of micro-mirrors according to an embodiment of the present invention.

FIG. 4 is a simplified perspective view of a spatial light modulator including an array of micro-mirrors according to an embodiment of the present invention. As illustrated in FIG. 4, a number of micro-mirrors are arranged in a spatial pattern to form a two-dimensional array. The micro-mirrors, supported by the standoff structures and torsion spring hinges as described above, are laterally separated by air gaps 410. For purposes of clarity, FIG. 4 provides an illustration in which portions of the spatial light modulator are omitted as a function of position to illustrate the three-dimensional nature of the spatial light modulator according to embodiments of the present invention.

As described above, because the air gaps between adjacent mirrors are formed using photolithograph processes, the spacing between adjacent mirrors is a predetermined distance. For example, in an embodiment, the air gap 410 is 0.8 μm. In other embodiments, the air gap 410 ranges from about 0.3 μm to about 1.0 μm. Of course, the particular air gap will depend on the particular application and may not be the same on all sides of a particular micro-mirror. The fill-factor of a micro-mirror array, defined as the area of the reflective surfaces divided by the total area of the array, increases as the gap between adjacent micro-mirrors decreases. In display applications, increases in fill-factor typically result in improvement in the image quality produced by the spatial light modulator. Thus, embodiments of the present invention provide photolithographically defined spacings between mirrors and controllable fill-factors.

Figure 5A:
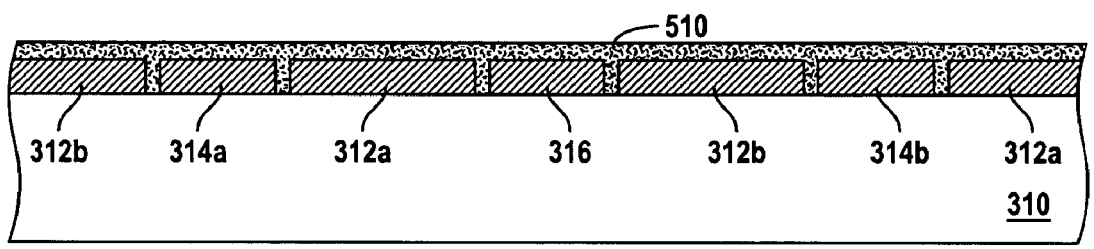
FIGS. 5A and 5B are simplified schematic illustrations of an electrode substrate at various stages of a fabrication process according to an embodiment of the present invention.
Figure 5B:
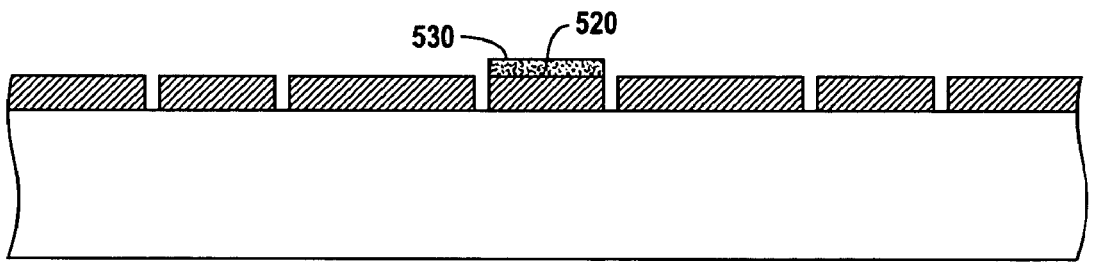

FIGS. 5 and 6 are simplified schematic illustrations of a spatial light modulator at various stages of a fabrication process according to an embodiment of the present invention. FIG. 5A illustrates the formation of layer 510 on substrate 310. In an embodiment, the layer 510 is a dielectric layer suitable for formation of dielectric bond pads 520 as illustrated in FIG. 5B and described below. In the embodiment illustrated in FIG. 5A, a 5,000 Å layer of silicon dioxide is deposited on substrate 310 and subsequently patterned to form the dielectric bond pads 520, but this is not required by the present invention. Other suitable materials that provide a contact region suitable for bonding of substrate 310 to another substrate is utilized in alternative embodiments. Alternative embodiments utilize deposited and patterned layers of silicon nitride, silicon oxynitride, spin-on-glass (SOG), low-k dielectrics, or the like. Moreover, dielectric bond pads 520 may be formed by a combination of such layers.

Preferably, a dielectric layer is deposited by a low temperature process that preserves the integrity of the control circuitry and electrodes fabricated on substrate 310 in previous processing steps. For example, a low temperature plasma enhanced chemical vapor deposition (PECVD) process is used in one embodiment to deposit a dielectric layer covering substrate 310. Alternative embodiments employ atmospheric or low pressure chemical vapor deposition (CVD) process to form the dielectric layer. The dielectric layer may be planarized after deposition, for example, by using a chemical mechanical polishing (CMP) process to form a uniform upper dielectric surface for the layer from which the dielectric bond pads are formed. Planarization processes for dielectric layers utilized in multilevel interconnect applications are well known to one of skill in the art.

After deposition of one or more dielectric layers and optional polishing steps, a photoresist layer (not shown) is deposited on the dielectric layer or layers. The photoresist layer is utilized in patterning of the dielectric through etching or other techniques to form the dielectric bond pads 520 illustrated in FIG. 5B. As illustrated in FIG. 5B, the deposited dielectric layer utilized to form the dielectric bond pads 520 is removed from all portions of the substrate 310 other than where the bond pads are present, but this is not required by the present invention. In alternative embodiments, portions of the dielectric layer remain on the substrate 310 and cover control electrodes 312 to provide passivation benefits. In embodiments in which CMP processes are utilized to planarize the deposited dielectric layer, the upper surfaces 530 of bond pads 520 provide an extremely smooth surface suitable for bonding to portions of substrate layer 610 as described more fully below.

In alternative embodiments, support pads 316 as illustrated in FIG. 5A are not utilized and the layer 510 makes contact with substrate 310 at the locations where support pads 316 are illustrated in FIGS. 5A and 5B. In these embodiments, the height of the bond pad 520 is defined by the thickness of the dielectric layer or layers 510 as deposited and planarized as described above.

In a particular embodiment of the present invention, the geometry of the bond pads 520 formed on the electrode substrate (i.e. the CMOS substrate) are selected to correspond to the geometry of the standoff structures formed on the mirror substrate illustrated in FIG. 6 and described below. Thus, in this particular embodiment, the geometry of the bond pads 520 is a rectangular parallelepiped defined by a length, a width, and a height. The length of the bond pad 520 illustrated in FIG. 2A extends along the x-axis. In an embodiment, the dimensions of the micro-mirror 640 are approximately 15 μm by 15 μm on a side and the length of the bond pad 520 measured in the x-direction is approximately 20 μm. The width of the bond pad 520 measured in the y-direction is a predetermined width. In a specific embodiment, the width is approximately 2 μm. In other embodiments, the width ranges from about 1 μm to about 3 μm. Of course the dimensions of the length and width of the bond pads 520 will depend on the particular application.

Figure 6A:
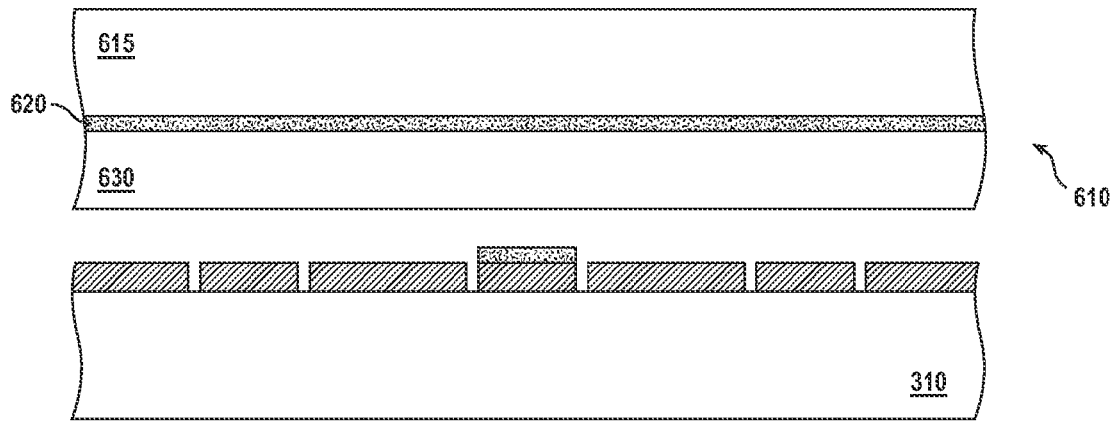
FIGS. 6A-6G are simplified schematic illustrations of an spatial light modulator at various stages of a fabrication process according to an embodiment of the present invention.

FIGS. 6A-6G are simplified schematic illustrations of a spatial light modulator at various stages of a fabrication process according to an embodiment of the present invention. As illustrated in FIG. 6A, multi-layer substrate structure 610 includes handling layer 615, insulating layer 620, and device layer 630. In some embodiments, the multi-layer substrate 610 is referred to as a mirror substrate since mirror layers are formed from a portion of the multi-layer or composite substrate. In a particular embodiment, composite substrate 610 is a silicon-on-insulator (SOI) substrate including a silicon layer 615, a silicon dioxide layer 620 (buried oxide layer), and an additional silicon layer 630. In alternative embodiments, the insulating layer comprises a silicon nitride layer or a composite oxide/nitride layer. Also illustrated in FIG. 6A is CMOS substrate 310, prepared as discussed in relation to FIG. 5.

Figure 6B:
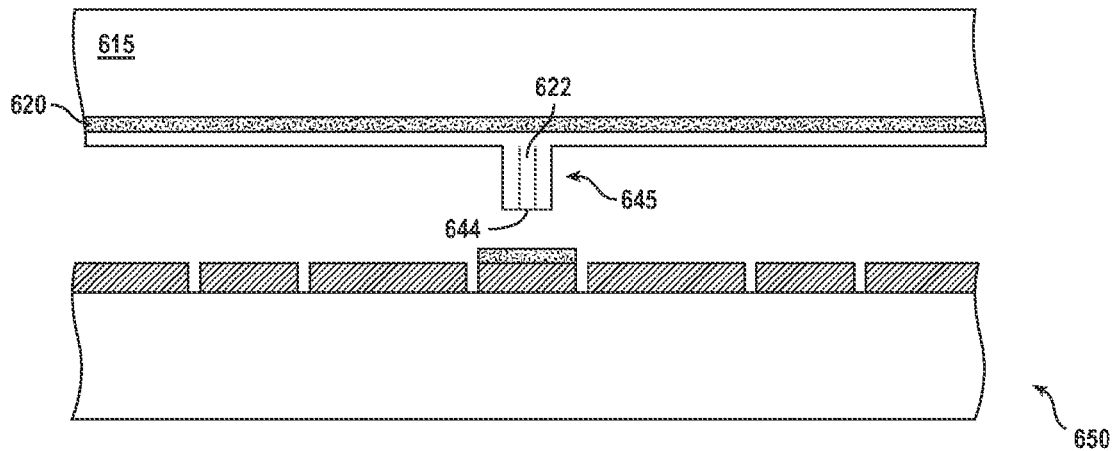

In FIG. 6B, device layer 630 has been processed to form standoff structures 645 including face 644. Prior to the processing step, face 644 was the lower surface of layer 630. Although the side view presented in FIG. 6B does not provide an illustration of the extension arms 642, reference to FIG. 2B will illustrate the extension arms 642 extending in opposite directions from centrally located base section. Of course, a number of standoff structures, arranged in a spatial pattern as an array are fabricated simultaneously according to embodiments of the present invention. Referring to FIGS. 2B and 6B, dashed rectangle 622 represents the spacing 240 between lateral extension arms 242 and 244 extending to one side of the centrally located base section 650.

Standard photolithography techniques can be used to generate a patterned mask layer. Typically, the mask layer, such as silicon oxide, is deposited on device layer 630. The mask layer is then patterned to form the mask used in the process of forming the standoff structures. The mask layer is typically characterized by a two-dimensional pattern in the plane of the device layer. The mask layer defines regions of the device layer that will be etched during a subsequent etching process or series of etching processes, forming standoff structures 645. The etch processes utilized will form standoff structures with predetermined profiles and heights.

In an embodiment, the device layer 630 is etched in a reactive ion etch chamber flowing with $SF_6$, HBr, and oxygen gases at flow rates of 100 sccm, 50 sccm, and 10 sccm respectively. The operating pressure is in the range of 10 to 50 mTorr, the bias power is 60 W, and the source power is 300 W. In another embodiment, the device layer 630 is etched in a reactive ion etch chamber flowing with $Cl_2$, HBr, and oxygen gases at flow rates of 100 sccm, 50 sccm, and 10 sccm, respectively. In these embodiments, the etch processes stop when the height of the standoff structure, measured perpendicular to the device layer is about 1.5 μm. In alternative embodiments, the height of the standoff structure ranges from about 0.8 μm to about 3.0 μm. The height will depend on the particular applications. Generally, this height is typically measured using in-situ etch depth monitoring, such as in-situ optical interferometer techniques, or by timing the etch rate.

In another embodiment, the standoff structures are formed in the device layer 630 by an anisotropic reactive ion etch process. The substrate is placed in a reaction chamber. $SF_6$, HBr, and oxygen gases are introduced into the reaction chamber at a total flow rate of 100 sccm, 50 sccm, and 20 sccm, respectively. A bias power setting of 50 W and a source power of 150 W are used at a pressure of 50 mTorr for approximately 5 minutes. The substrate is then cooled with a backside helium gas flow of 20 sccm at a pressure of 1 mTorr. In one particular embodiment, the etch processes stop when the height of the standoff structure, measured perpendicular to the device layer is about 1.5 μm. Generally, this height is measured using in-situ etch depth monitoring, such as in-situ optical interferometer techniques, or by timing the etch rate.

As will be appreciated by reference to FIG. 2B, the geometry of the standoff structures approximates the letter "H" when viewed along the z-direction. The dimensions of the outer periphery of the standoff structure 645 is generally selected to correspond to the dimensions of the bond pads 520. For example, in embodiments, in which the length and width of the bond pad 520 are (not 20) 14 μm and 2 μm respectively, the length and width of the standoff structure are also 14 μm and 0.4 μm. In alternative embodiments, the dimensions of the standoff structures 645 are selected to provide a margin of unbonded material at the edges of bond pads 520. One of ordinary skill in the art would recognize many variations, modifications, and alternatives.

Figure 6C:
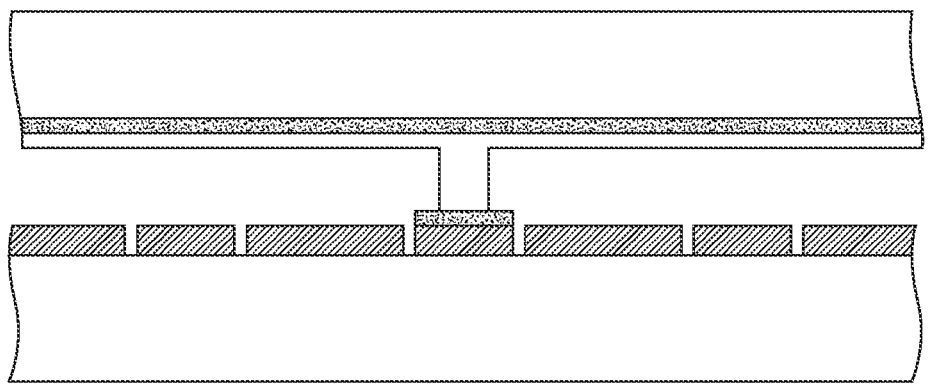

FIG. 6C illustrates the joining of substrates 610 and 310 to form a composite substrate structure. Alignment of the substrates prior to bonding is performed according to processes well known to one of skill in the art. In a particular embodiment, the bonding surface 644 of standoff structures 645 is a polished single crystal silicon surface. Wafer bonding techniques are used in some embodiments to form a hermetic seal between bonding surface 644 and bonding surface 530 of bond pads 520. For example, bonding may be accomplished through the use of anodic, eutectic, fusion, covalent, glass frit, and other bonding techniques. In embodiments in which bond pads 520 and standoff regions 645 are silicon dioxide and silicon, respectively, room temperature covalent bonding techniques are used to form a hermetically sealed bond between the structures. In embodiments in which standoff regions 645 and bond pads 520 are silicon, room temperature covalent bonding techniques are used to form a hermetically sealed bond between the substrates. Of course, one of ordinary skill in the art would recognize many variations, modifications, and alternatives.

Figure 6D:
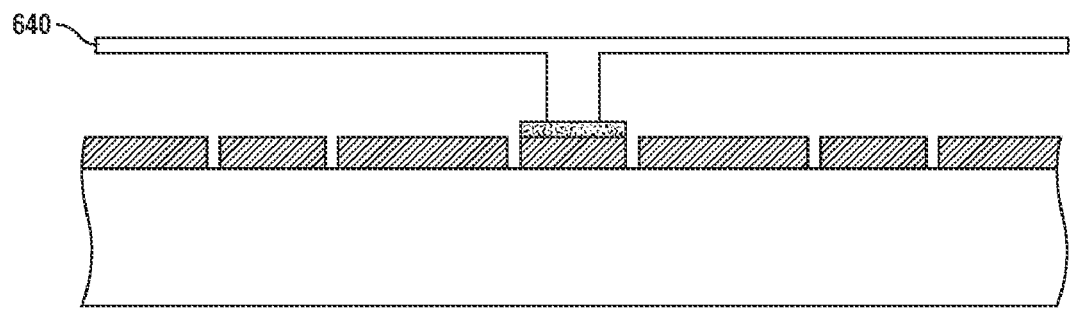

In some embodiments, substrate 610 initially includes multiple layers for structural support and to provide benefits during processing. In these embodiments, upper layers 615 and 620 of substrate 610 are removed in a subsequent processing step, as illustrated in FIG. 6D. In order to thin substrate 610 after bonding, thinning processes using chemical mechanical polishing (CMP), grinding, etch back, any combination of these, and the like are used. In one application, the buried oxide layer 620 provides an etch stop layer during the thinning process. In a particular embodiment, after these layer removal and/or polishing steps, the thickness of the layer 640 is 0.3 μm. Therefore, the thickness of the layer 640 is selected to optimize design constraints for the micro-mirror devices, including structural rigidity, flexibility, and amount of inertia. Moreover, as described more fully below, other portions of layer 640 are processed to form torsion spring hinges coplanar with the mirror layer. Thus, the thickness of the layer 640 is also selected to optimize design constraints for the torsion spring hinges.

Figure 6E:
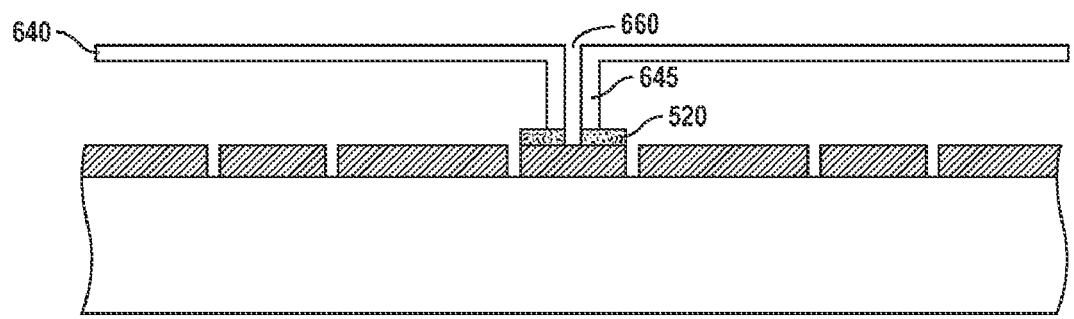

FIG. 6E illustrates a spatial light modulator at another stage of a fabrication process according to an embodiment of the present invention. As illustrated in FIG. 6E, openings 660 have been made in layer 640 of layer 640, as well as through central portions of standoff structure 645 and dielectric bond pads 520. In an embodiment, a photoresist layer is deposited on the upper surface of layer 640, patterned and used as an etch mask to etch openings 660 through layer 640 and structures 645 and 520. In a specific embodiment, the etch process is terminated at the lower surface of dielectric bond pads 520 when the TiN layer present on layer 316 is reached. Etch chemistry that is selective for silicon and silicon dioxide over TiN is well known to one of skill in the art. As illustrated in the figure, an anisotropic etch that produces straight side walls for feature 660 is used in some embodiments, although this is not required by the present invention. In alternative embodiments, other etch processes that produce openings of sufficient size and profile are utilized.

Figure 6F:
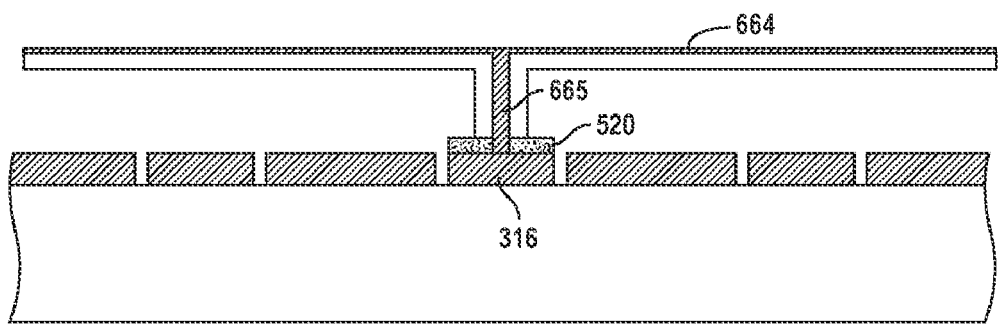

FIG. 6F illustrates a spatial light modulator at yet another stage of a fabrication process according to an embodiment of the present invention. As illustrated in the figure, at least one layer of material 664 has been deposited on the layer 640 and in openings 660. In some embodiments of the present invention, the deposited material is able to both conduct electricity and reflect optical radiation. In a particular embodiment, the material 664 is a multi-layer stack of metals preferentially deposited on the surface of layer 640 and in openings 660. Preferably, the material 664 and 665 is made of a deposited TiN layer and a deposited aluminum layer. For example, in a specific embodiment, the TiN layer is 150 Å thick and the aluminum layer is 300 Å thick. In alternative embodiments according to the present invention, the thickness and composition of the deposited layer or layers of material 664 is varied, utilizing other materials that conduct electricity and reflect light in the visible region.

As illustrated in FIG. 6F, multi-layer stack 664 provides a reflective coating on the upper surface of layer 640. As described more fully below, portions of layer 640 are processed to form micro-mirrors, which reflect light incident from above layer 640. Thus, the upper layer of stack 664 illustrated in FIG. 6F, which includes an aluminum layer, provides a high reflectivity coating for the mirror surface suitable for reflecting incident radiation in the visible region.

Moreover, since the deposited material passes through insulating dielectric layer 520, layer 665 provides for electrical connection between the mirrors formed in portions of layer 640 and a bias grid (not shown) coupled to support pads 316. As illustrated in FIG. 6F, material 665 and support pads 316 are coupled at the upper surface of the TiN layer deposited as the upper portion of support pads 316. Thus, structures 664 and 665 provide not only a reflective coating on the upper surface of layer 640, but also provide for an electrical connection between the mirror surface and the bias grid.

In some embodiments, the bias grid is present on the same masking level as the electrodes 312 and support pads 316. In alternative embodiments, the bias grid is present on another level, for example, the same masking level as metals deposited and patterned prior to electrodes 312 and support pads 316. In these alternative embodiments, the bias grid is electrically connected to the support pads 316 through the use of vias, reducing the number of physical structures present at the electrodes masking level and simplifying the electrical design. One of ordinary skill in the art would recognize many variations, modifications, and alternatives. As the structure 664 is present on the upper surface of the hinges extending toward the corners of the micro-mirror, the multi-layer stack provides electrical connectivity between the bias grid and the entire mirror surface. Semiconductor processing techniques suitable for enhancing the electrical contact between the conductive layer 664/665 and the support pads 316 are well known to one of skill in the art, including plasma treatment after formation of openings 660 and prior to deposition of the first layer making up the multi-layer stack 664/665.

Although in some embodiments, layers 664 and 665 are distinguishable, in other embodiments, a single reflective and conductive material is used both to fill the openings 645 and coat the surface of layer 640. Moreover, in some embodiments, the material 665 does not completely fill the openings 645, but still provides a continuous electrical path from the bias grid to the layer 664.

Figure 6G:
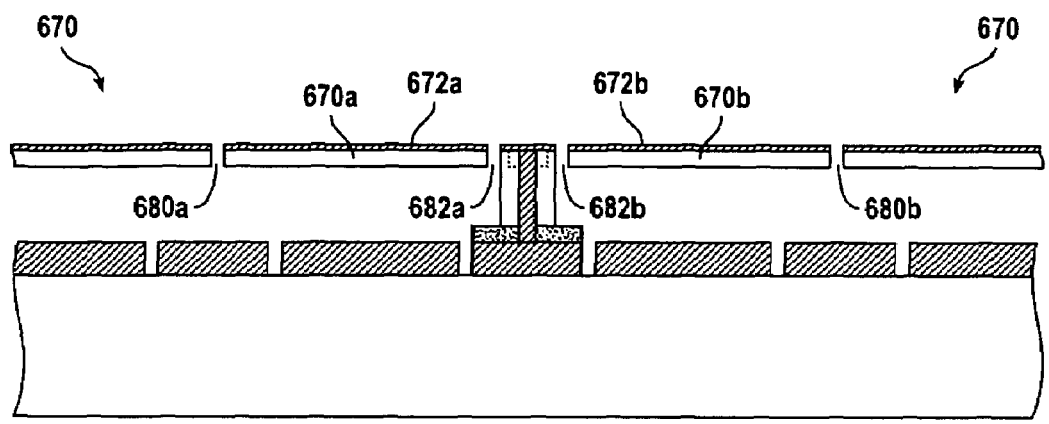

FIG. 6G illustrates a spatial light modulator at a further stage of a fabrication process according to an embodiment of the present invention. As illustrated, layer 640 has been patterned using photolithographic processes and processed to form a number of openings 680*a*, 680*b*, 682*a*, and 682*b*, creating a number of micro-mirrors 670. Although FIG. 6G illustrates a cross-sectional view of the mirror structures, one of ordinary skill in the art will appreciate that a three-dimensional structure is represented by the figure. Openings 680 provide for separation between adjacent micro-mirrors. As discussed in relation to FIG. 4, the fill-factor for the micro-mirror array is a function of the gap between adjacent mirrors. Because the openings 680 are defined using well developed photolithographic processes, the dimensions of the openings are generally well-controlled and may be as small as sub-micron dimensions. Openings 680 separate adjacent mirrors from each other, enabling for mirror rotation as described below.

Figure 6H:
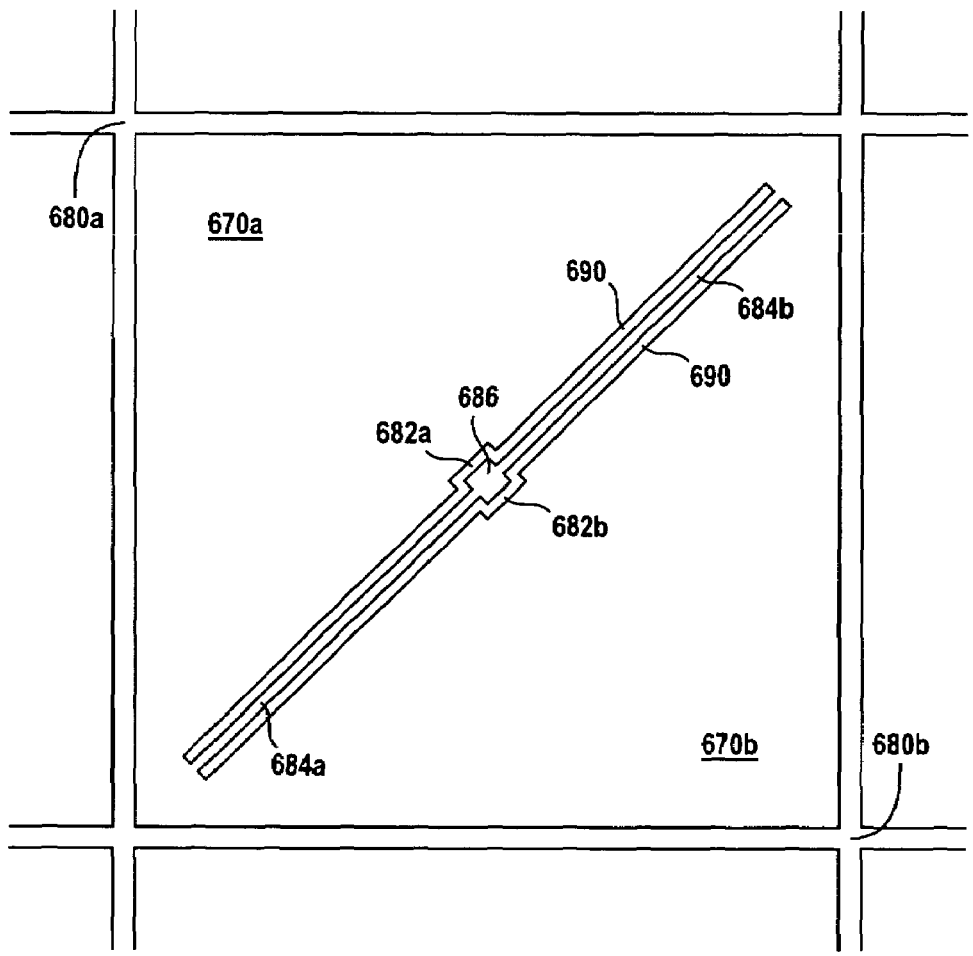
FIG. 6H is a simplified top-view illustration of a spatial light modulator according to an embodiment of the present invention.

Also illustrated in FIG. 6G and FIG. 6H are openings 682*a* and 682*b* formed in layer 640. Openings 682 partially define a torsion spring hinge along section 684 of micro-mirror 670. As shown in FIG. 2A, openings 680 cooperate with openings 690 to form a torsion beam coupled to mirror layer 640. As illustrated in FIG. 6H, the torsion beam, sometimes referred to as a torsion spring hinge, couples the micro-mirrors 670 to a central portion of standoff structure 645. In a specific embodiment, the openings 682 and 690 are formed in layer 640 and selected portions of standoff structures 645 to release the micro-mirror in a manner to allow for rotation of the mirror around an axis. Referring to both FIG. 6H and FIG. 2A, portions of the extension arms 642 initially coupled to the mirror surface at locations 690 are removed during the release process. In other words, sections 690 of the mirror layer are removed along with attached sections of the extension arms, exposing surfaces 692 on the extension arms. In the embodiment illustrated in FIG. 6H, the width of the torsion spring 684 measured along a direction (the y-direction) perpendicular to the length of the hinge (the z-direction) is a predetermined distance. In one specific embodiment, the width of the torsion spring hinge is 0.18 μm. In an alternative embodiment, the width ranges from about 0.1 μm to about 0.5 μm. The thickness of the torsion beam, measured in the z-direction, is equal to the thickness of layer 640 as illustrated in FIG. 6D.

As a result of the fabrication process described in relation to this embodiment, the centrally located base section extends to a greater z-height than the extension arms as illustrated in FIG. 2A. Thus, in this embodiment, the mirror layer 640 and the standoff structure 645 are in contact at the centrally located base section 210 while other sections of the upper portion of the standoff structure (namely the extension arms) have been removed. The removal process is performed to provide sufficient clearance between the upper portions 692 of the standoff structure and the mirror layer 640 for the mirror to rotate freely under the influence of an applied electric field and placed in an activated state. In the activated state, the torsion force present in the torsion beam provides a restoring force to return the mirror to the unactivated state after removal of the applied electric field. Moreover, because of the spacer (reference numeral 240 in FIG. 2B and reference numeral 622 in FIG. 6B) formed between adjacent extension arms, the majority of section 684 of the torsion beam is not coupled to the standoff structure, but functions as a torsion spring for mirror 670.

The standoff structures employed in embodiments of the present invention provide a mounting surface for the micro-mirror with material properties and dimensions that facilitate bonding of substrates 310 and 610. In some substrate bonding processes, voids are formed at the bond interface, weakening the bond and presenting reliability problems. Embodiments of the present invention reduce the adverse impacts of voids possibly formed at the bond interface. For example, referring to FIG. 2B, the interface between the mirror layer 640 and the standoff structure 645 is fabricated from a single piece of material in the illustrated embodiment. In a particular embodiment, the interface between the mirror layer 640 and the standoff structure 645 is fabricated from a single crystal silicon substrate. Typically, the single crystal silicon substrate is formed as the substrate is cut from a boule or through an epitaxial process, providing a continuous material interface characterized by uniformity at the interface. For this interface, the void density is typically zero as a result of the substrate fabrication processes. Accordingly, the mechanical properties of the material at the interface between the mirror layer and the standoff structure, including the interface strength, are optimal.

Referring once again to FIGS. 2A and 2B, the characteristics of the interface between the standoff structure 645 and the bond pad 520 are a function of the substrate bonding process (or processes) used to join the substrates and form the composite substrate structure. Generally, the substrate bonding process is selected to reduce the number of voids formed at the bond interface. However, in embodiments of the present invention, the dimensions of the lower portions of the standoff structure provide a robust bond, even in the presence of some voids. As illustrated in FIGS. 2A and 2B, the outer dimensions of the lower portion of the standoff structure are approximately 14 μm by 2 μm. In particular, the dimensions of the extension arms 642 are approximately 14 μm by 0.6 μm, providing a bonding surface that is able to tolerate a number of voids without significant impact on interface strength and reliability.

Moreover, the geometry of the standoff structure and torsion spring hinge are not limited to the geometry illustrated in FIG. 2. In alternative embodiments of the present invention, the shape and dimensions of the standoff structure and torsion spring hinge are modified as appropriate to other applications. In some embodiments, the width of the extension arms 642 are increased to provide additional surface area for the substrate bonding process, thereby increasing the reliability of the bond between the standoff structure and the second substrate. In other embodiments, the width and length of the centrally located base section is increased to increase the surface area of the integrated interface between the upper portion of the standoff structure and the mirror layer. Furthermore, the dimensions of the torsion spring hinge are variable and may be selected to achieve system goals such as flexibility and reliability of the hinge.

Figure 7:
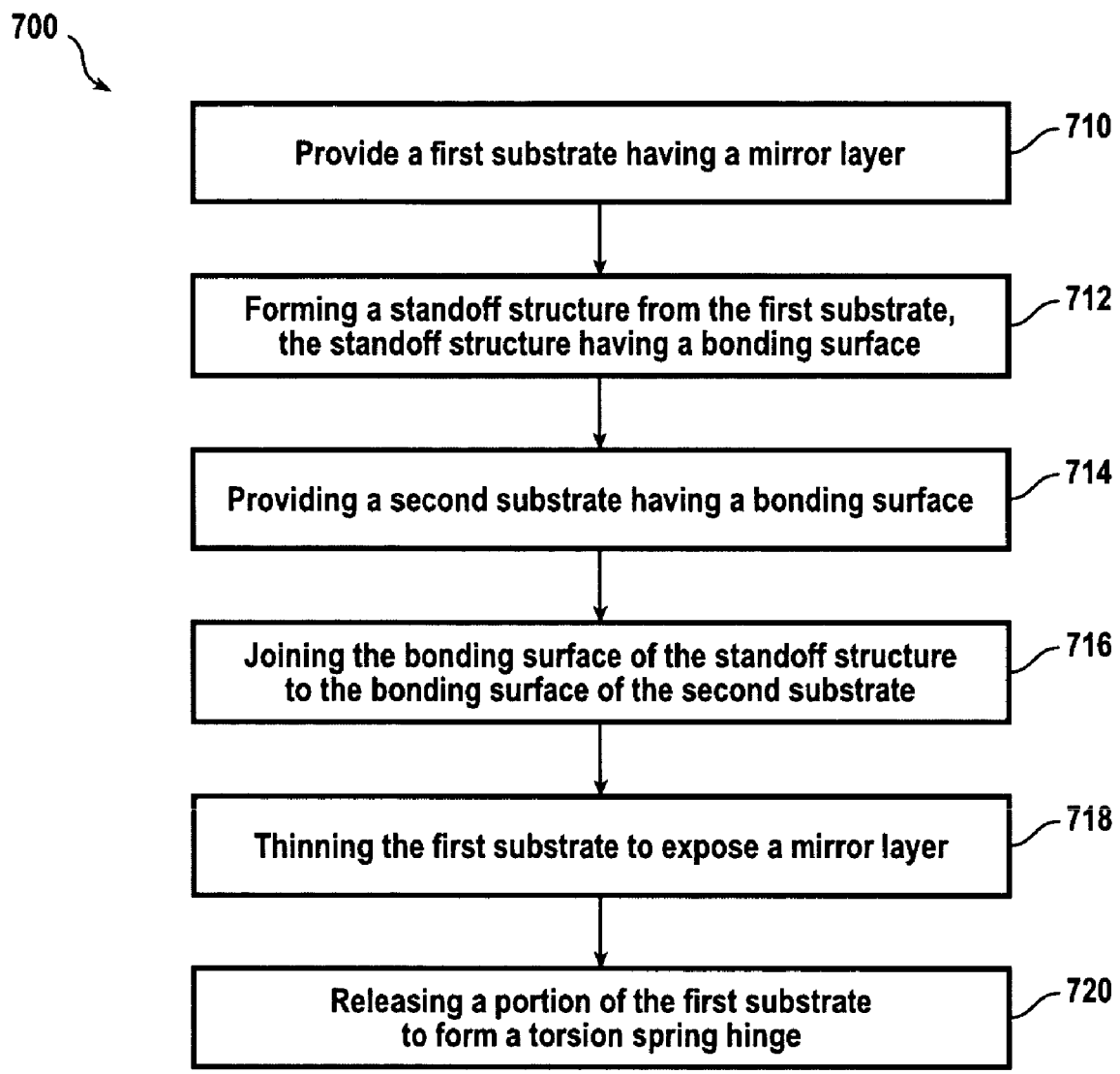
FIG. 7 is a simplified flowchart illustrating one method of fabricating a spatial light modulator according to an embodiment of the present invention.

FIG. 7 is a simplified flowchart illustrating one method of fabricating a spatial light modulator according to an embodiment of the present invention. Process 700 includes providing a first substrate having a mirror layer in step 710. As described previously, in a specific embodiment, the first substrate is a multi-layer substrate structure, such as a SOI substrate. The dimensions of the layers making up the multi-layer substrate are selected to satisfy various design constraints. For example, in one embodiment of the present invention, a silicon layer is provided that is thick enough to form a mirror layer integrated with a standoff structure. The surfaces of the SOI substrate are polished in some embodiments to facilitate substrate bonding processes in subsequent processing steps.

Step 712 includes forming a standoff structure from the first substrate. In some embodiments, the standoff structure is formed by an etching process. In this embodiment, a surface of the first substrate is masked and etched to form a standoff structure extending from the first substrate. Typically, a mask is generated to define the portion of the first substrate that will be etched to form the standoff structures. Standard techniques, such as photolithography, can be used to generate the mask on the first substrate. As mentioned previously, in an embodiment the micro-mirrors and standoff structures are formed from a single material, such as single crystal silicon. The structures fabricated to create the micro-mirrors and standoff structures are typically larger than the features used in CMOS circuitry, so it is relatively easy to form the micro-mirrors and standoff structures using known techniques for fabricating CMOS circuitry.

After the mask is generated, the first substrate is anisotropically etched in an embodiment to form the standoff structures. Other methods besides an anisotropic etch may also be used to form the standoff structures, such as a wet etch or a plasma etch. One of ordinary skill in the art would recognize many variations, modifications, and alternatives. Because the unetched surface of the standoff structure is masked during fabrication, this surface provides a bonding surface for subsequent substrate bonding processes. As mentioned previously, the polished substrate surface, present at the unetched surface of the standoff structure, provides a high quality bonding surface.

A second substrate is provided in step 714. Typically, the second substrate is an electrode substrate, e.g. a CMOS substrate, including a number of electrodes and bond pads. In embodiments according to the present invention, the second substrate includes a bonding surface adapted to align with the standoff structures fabricated on the first substrate. In some embodiments, the bonding surface is a dielectric bond pad formed in contact with the second substrate, but this is not required by the present invention. In other embodiments, the bonding surface is a portion of the second substrate. The bonding surface associated with the second substrate is typically polished or otherwise fabricated to provide a smooth surface suitable for substrate bonding processes.

In step 716, the bonding surface of the standoff structure is joined to the bonding surface of the second substrate. The first substrate and the second substrate are aligned so that the electrodes on the second substrate are in a proper position to control the deflection of the micro-mirrors formed in subsequent processing steps on the first substrate. In an embodiment, the two substrates are optically aligned using double focusing microscopes by aligning a pattern on the first substrate with a pattern on the second substrate and the two substrates are bonded together by low temperature bonding methods such as anodic or eutectic bonding. There are many possible alternate embodiments to the bonding process illustrated by step 716. For example, thermoplastics or dielectric spin glass bonding materials may be used so that that substrates are bonded thermo-mechanically.

After bonding the first and second substrate together, the surface of the first substrate opposite the standoff structures is thinned to a predetermined thickness in step 718. First, the handling layer 615 is removed, typically by grinding or etching. Then the insulating layer 620 is removed. Then the device layer 630 is thinned or polished, if necessary. This thinning is done in an embodiment by mechanically grinding the first substrate to a thickness that is near the desired thickness of the micro-mirror. For example, in this embodiment, the thickness achieved by mechanical grinding is approximately 5 microns. The first substrate is then polished by mechanical fine polishing or chemical mechanical polishing to the thickness desired for the micro-mirror layer. In an embodiment according to the present invention, this desired thickness is less than approximately 1 μm. In a specific embodiment, this desired thickness is 0.3 μm.

In step 720, the first substrate is masked and processed to release a portion of the first substrate to form a torsion beam or torsion spring hinge that is coplanar with the micro-mirror layer. Referring to FIGS. 2A and 6H, in an embodiment, a high-aspect-ratio anisotropic etching process is used to define the mirror plate 670, the torsion spring hinge 684, and the centrally located base section 686. The release step removes a portion 682 of the mirror layer adjacent to the centrally located base section as well as a portion of the mirror layer 690 and the portions of the extension arms above surface 692 of the extension arms. Thus, the centrally located base section provides a connector between the torsion spring hinge coupled to the mirror plate and the standoff structure bonded to the second substrate. Additionally, the release step 720 includes the separation of adjacent mirrors from each other, represented by openings 680 in FIGS. 6G and 6H. In an embodiment, the width of release section 682 is 0.2 μm. In alternative embodiments, the width varies from about 0.1 μm to about 1.0 μm. Moreover, in some embodiments, the release sections 690 extend to about 1 μm from the corner of the mirror.

The examples and embodiments described herein are for illustrative purposes only. Various modifications or changes in light thereof will be suggested to persons skilled in the art and are to be included within the spirit and purview of this application and scope of the appended claims. It is not intended that the invention be limited, except as indicated by the appended claims.

What is claimed is:

1. A spatial light modulator, the spatial light modulator comprising:
   a first substrate comprising a plurality of electrically activated electrodes and a bias grid;
   a standoff structure coupled to the first substrate, the standoff structure comprising:
      a central portion projecting to a first height above the first substrate, and
      an extension portion projecting to a second height above the first substrate, the extension portion including two sets of lateral extension arms coupled to and extending away from the central section, each set comprising at least two arms coupled to the first substrate and defining a cavity region bounded on two sides by the at least two arms and a third side by the first substrate, wherein the second height is less than the first height;

a mirror plate comprising:
- a central contact structure integrally formed with the central portion of the standoff structure,
- a torsion beam coplanar with the central contact structure and free from contact with the standoff structure, and
- a reflective surface coupled to the torsion beam and free from contact with the standoff structure.

2. The spatial light modulator of claim 1 wherein the central portion of the standoff structure comprises a body section extending from the first substrate to the mirror plate.

3. The spatial light modulator of claim 2 wherein the bias grid is electrically coupled to the mirror plate by a via passing through the body section of the central portion of the standoff structure.

4. The spatial light modulator of claim 2 wherein the standoff structure and the mirror plate are formed from a single piece of material.

5. The spatial light modulator of claim 4 wherein the single piece of material is single crystal silicon.

6. The spatial light modulator of claim 1 wherein the standoff structure is coupled to the first substrate by a substrate bonding process.

7. The spatial light modulator of claim 1 wherein the standoff structure is coupled to the first substrate at a location between a pair of complementary electrodes.

8. The spatial light modulator of claim 1 wherein the torsion beam comprises a plurality of torsion arms extending in opposite directions from the central contact structure.

9. The spatial light modulator of claim 8 wherein the plurality of torsion arms extend along a diagonal direction with respect to the mirror plate.

10. A micro-mirror flexibly supported by a standoff structure, the micro-mirror comprising:
- a mirror layer having an upper surface operable for reflecting incident radiation and a lower surface opposite the upper surface;
- a first portion of the standoff structure integrally formed with the mirror layer comprising:
  - a first planar interface coupled to the lower surface of the mirror layer;
  - a second planar interface opposite the first planar interface; and
  - a body section extending along a first axis from the first planar interface to the second planar interface; and
- a second portion of the standoff structure coupled to the first portion of the standoff structure and including a set of lateral extension arms extending along a second axis perpendicular to the first axis, the second portion comprising:
  - an upper surface physically separated from the plane of the first planar interface by a first distance;
  - a lower surface coplanar with the second planar interface; and
  - a body section including the set of lateral extension arms extending along the second axis and defining a cavity region between the set of lateral extension arms; and
- a substrate coupled to the second planar interface of the first portion of the standoff structure and to the lower surface of the second portion of the standoff structure.

11. The micro-mirror of claim 10 wherein the mirror layer and the standoff structure comprise a single continuous piece of material.

12. The micro-mirror of claim 10 wherein the upper surface of the second portion of the standoff structure is physically separated from the plane of the first planar interface by an etching process.

13. The micro-mirror of claim 12 wherein the etching process is an anisotropic etching process.

14. The micro-mirror of claim 10 wherein the mirror layer comprises a central support region and a plurality of torsion arms coupled to the central support region.

15. A method of fabricating a spatial light modulator, the method comprising:
- providing a first substrate structure comprising a plurality of layers;
- forming a standoff structure in a first layer selected from the plurality of layers of the first substrate structure;
- providing a second substrate comprising a bonding surface and a support surface;
- joining the standoff structure to the bonding surface of the second substrate;
- removing at least a second layer selected from the plurality of layers of the first substrate structure;
- selectively patterning the first layer of the first substrate structure to form a micro-mirror; and
- selectively patterning the first layer to remove a portion of the standoff structure and form a torsion spring hinge co-planar with the micro-mirror.

16. The method of claim 15 wherein selectively patterning the first layer comprises etching the first layer.

17. The method of claim 16 wherein etching comprises a dry etch process.

18. The method of claim 15 wherein the first substrate structure comprises a silicon on insulator substrate.

19. The method of claim 15 wherein the first layer selected from the plurality of layers of the first substrate structure is a silicon layer.

20. The method of claim 15 wherein the second layer selected from the plurality of layers of the first substrate structure is an insulator layer.

21. The method of claim 15 wherein selectively patterning the first layer of the first substrate structure to form a micro-mirror and selectively patterning the first layer to remove a portion of the standoff structure are initially performed simultaneously.

22. The method of claim 15 wherein the standoff structure is formed substantially in the shape of an "H" when viewed in a direction orthogonal to the micro-mirror.

* * * * *